US006471735B1

(12) United States Patent
Misra et al.

(10) Patent No.: US 6,471,735 B1
(45) Date of Patent: Oct. 29, 2002

(54) COMPOSITIONS FOR USE IN A CHEMICAL-MECHANICAL PLANARIZATION PROCESS

(75) Inventors: Ashutosh Misra, Plano, TX (US); Joe G. Hoffman, Dallas, TX (US); Anthony J. Schleisman, Plano, TX (US)

(73) Assignee: Air Liquide America Corporation, Houston, TX (US)

( * ) Notice: Subject to any disclaimer, the term of this patent is extended or adjusted under 35 U.S.C. 154(b) by 84 days.

(21) Appl. No.: 09/634,852

(22) Filed: Aug. 8, 2000

Related U.S. Application Data
(60) Provisional application No. 60/149,312, filed on Aug. 17, 1999.

(51) Int. Cl.[7] .............................. C09K 3/14; C09G 1/02; C09G 1/04; B24B 1/00
(52) U.S. Cl. .............................. 51/308; 51/307; 51/309; 106/3; 252/79.3; 252/79.4; 438/692; 438/693; 451/36
(58) Field of Search .......................... 51/307, 308, 309; 106/3; 438/692, 693; 252/79.3, 79.4; 510/395, 397, 367, 368; 451/36

(56) References Cited

U.S. PATENT DOCUMENTS

| | | | |
|---|---|---|---|
| 5,071,510 A | * 12/1991 | Findler et al. .............. 156/647 |
| 5,728,308 A | 3/1998 | Muroyama .................. 216/88 |
| 5,860,848 A | 1/1999 | Loncki et al. ................ 451/36 |
| 5,909,628 A | 6/1999 | Chatterjee et al. ........... 438/424 |
| 5,923,993 A | 7/1999 | Sahota ........................ 438/427 |
| 5,928,621 A | 7/1999 | Ledon et al. ................ 423/584 |
| 5,932,187 A | 8/1999 | Ledon et al. ................ 423/584 |
| 5,938,505 A | 8/1999 | Morrison et al. ............. 451/36 |
| 5,961,947 A | 10/1999 | Ledon et al. ................ 423/584 |
| 6,001,324 A | 12/1999 | Ledon et al. ................ 423/584 |
| 6,019,806 A | 2/2000 | Sees et al. ..................... 51/308 |
| 6,136,711 A | * 10/2000 | Grumbine et al. .......... 438/692 |

FOREIGN PATENT DOCUMENTS

| JP | 8250461 | * 9/1996 |
|---|---|---|
| JP | 974080 | * 3/1997 |

OTHER PUBLICATIONS

John M. Boyd and Joseph P. Ellul, "A One–Step Shallow Trench Global Planarization Process Using Chemical Mechanical Polishing", J. Electrochem. Soc., vol. 144, No. 5, pp. 1838–1841, May 1997.

* cited by examiner

*Primary Examiner*—Michael Marcheschi
(74) *Attorney, Agent, or Firm*—Linda K. Russell

(57) ABSTRACT

Provided are methods for making a slurry composition, suitable for use in a chemical-mechanical planarization process. Also provided are compositions made by such methods. The methods comprise combining: (a) abrasive particles; (b) a suspension medium; (c) a peroxygen compound; (d) an etching agent; and (e) an alkyl ammonium hydroxide. The methods and compositions of the present invention are particularly applicable to the semiconductor manufacturing industry.

39 Claims, No Drawings

COMPOSITIONS FOR USE IN A CHEMICAL-MECHANICAL PLANARIZATION PROCESS

CROSS REFERENCE TO RELATED APPLICATION

This application claims under 35 U.S.C. §119(e) the benefit of provisional application Ser. No. 60/149,312, filed Aug. 17, 1999, the contents of which application are incorporated herein by reference.

BACKGROUND OF THE INVENTION

1. Field of Invention

The present invention pertains to novel compositions suitable for use in a chemical-mechanical planarization process, and methods for making same. The present invention also pertains to novel methods for planarizing a substrate using chemical-mechanical planarization. The compositions and methods of the present invention are preferably used in the formation of a shallow trench isolation structure upon a semiconductor substrate. The invention has particular applicability to the semiconductor manufacturing industry.

2. Description of the Related Art

Shallow-trench isolation (STI) structures are used to electronically isolate the components in an integrated circuit. Conventional processes for fabricating STI structures include depositing an oxide layer and a silicon nitride layer in sequence over a semiconductor substrate. Selected areas of these layers are then etched using known techniques, thereby forming trenches upon the substrate surface. The silicon nitride layer and oxide layer are sequentially etched until a desired depth in the substrate is reached. An oxide layer is subsequently deposited upon the substrate, thereby filling the trenches. Chemical-mechanical planarization (CMP) is then used to planarize the oxide layer, wherein the silicon nitride layer is used as a polishing stop. The silicon nitride layer is subsequently removed using an etchant such as, for example, phosphoric acid. Hydrofluoric acid can also be used as the etchant, for example, for etching materials other than silicon nitride. The remaining portions of oxide (formerly in the trenches) function as isolation structures.

A typical problem associated with CMP processes used in the formation of STI structures is that portions of the silicon nitride layer are unintentionally removed during the planarization of the oxide layer. Undesirable effects caused by this removal of the silicon nitride layer include, for example, the unintentional removal of the field oxide from the trench region of the device. This can result in the degradation of the electrical characteristics of the device. Thus, providing a high oxide-to-silicon nitride polish rate during the planarization of the oxide layer is desirable. However, current CMP slurries typically achieve oxide-to-silicon nitride polish rate selectivities of less than about 5:1.

Another problem in CMP processes relates to the uneven polishing of the field oxide layer of the substrate. Typically, trenches are unevenly distributed on a semiconductor substrate. As a result, typical semiconductor substrates include regions which have a relatively high density of trenches, and regions which have a relatively low density of trenches. Typically, the rate at which the field oxide present in the low-trench density regions is polished is higher than the rate at which the field oxide present in the high-trench density regions is polished. Uneven polishing of the substrate can result in the degradation of the electrical characteristics of the device.

Various alternatives have been proposed to ameliorate the aforementioned problems with CMP processes. For example, the controlled deposition of an extra film of silicon nitride on top of the silicon oxide has been proposed. See, e.g., Boyd, John M., "A One-Step Shallow Trench Global Planarization Process Using Chemical Mechanical Polishing," Journal of the Electrochemical Society, Vol. 144, No. 5, p. 1838, May 1997. See also U.S. Pat. No. 5,923,993. However, use of an additional deposition step can increase manufacturing costs, and substrates produced thereby are typically prone to manufacturing defects due to the dependence of planarization efficiency upon the thickness of the deposited sacrificial film.

Another proposed solution relates to inserting dummy active areas between the active areas in the substrate. See, e.g., U.S. Pat. No. 5,909,628. The dummy active areas are generally formed in the same manner as the active areas of the substrate, except that the dummy active areas are not later developed into active or passive devices. The dummy active areas are inserted in the portion of the substrate which would normally be occupied by a field oxide to reduce dishing in these areas. Dishing occurs when portions of the substrate are overpolished, resulting in a non-planarized surface. While the insertion of dummy active areas may reduce the occurrence of dishing, this method typically requires a patterning (lithography) step to create the dummy active areas, which thereby increases manufacturing costs.

The use of slurries that contain abrasive particles which are made of material other than silicon oxide has also been proposed. For example, CMP slurry manufacturers have experimented with using abrasive particles made of cerium oxide. The drawbacks of using cerium oxide include the formation of microscratches on the wafer surface. In addition, the treatment and disposal of used slurries containing cerium oxide abrasive particles are not well understood.

The related art discloses various slurries for use in chemical-mechanical planarization processes, for example, in U.S. Pat. Nos. 5,728,308; 5,860,848; 5,938,505; and 6,019,806. However, the related art does not disclose the compositions of the present invention.

To meet the requirements of the semiconductor manufacturing industry and to overcome the disadvantages of the related art, it is an object of the present invention to provide a method for making a slurry composition, suitable for use in a chemical-mechanical planarization process, which can provide an increased oxide-to-silicon nitride polish rate selectivity.

Other objects and aspects of the present invention will become apparent to one of ordinary skill in the art upon review of the specification and claims appended hereto.

SUMMARY OF THE INVENTION

The foregoing objectives are met by the methods and compositions of the present invention. According to a first aspect of the invention, a method for making a slurry composition is provided, suitable for use in a chemical-mechanical planarization process. The method comprises combining:

(a) abrasive particles;
(b) a suspension medium;
(c) a peroxygen compound;
(d) an etching agent; and
(e) an alkyl ammonium hydroxide.

According to another aspect of the invention, a method for making a composition is provided, suitable for use in a chemical-mechanical planarization process wherein an abrasive planarizing surface is used. The method comprises combining:

(a) a peroxygen compound;

(b) an etching agent; and (c) an alkyl ammonium hydroxide.

DETAILED DESCRIPTION OF THE PREFERRED EMBODIMENTS OF THE INVENTION

According to one aspect of the present invention, a slurry composition is formed by combining abrasive particles, a suspension medium, a peroxygen compound, an etching agent and an alkyl ammonium hydroxide. The slurry compositions of the present invention are suitable for use in a chemical-mechanical planarization (CMP) process, preferably in the formation of a shallow trench isolation (STI) structure upon a semiconductor substrate. The slurry compositions are preferably used in a single-step CMP process and can be used with any CMP machine platform, including disk and endless belt-type platforms.

The present slurry compositions can provide an increased polish rate selectivity with respect to the oxide material in comparison with the polish stop material. For example, the slurry compositions can provide an increased oxide-to-silicon nitride polish rate selectivity during the polishing of a semiconductor substrate.

The abrasive particles of the slurry composition contribute to the mechanical planarization of a substrate surface, such as a semiconductor substrate surface, when the slurry composition is introduced between the substrate surface and a planarizing device such as, for example, a polishing pad. The specific type or types of abrasive particles employed typically depends at least on the material to be planarized. The abrasive particles can include silicon oxide, aluminum oxide, cerium oxide or combinations thereof, preferably silicon oxide.

The abrasive particles are dispersed in the suspension medium, and are typically present in an amount from about 2% to about 50%, preferably from about 10% to about 30%, by the combined weight of the abrasive particles and the suspension medium. The specific amount of abrasive particles, however, will typically at least depend on the particular process that is used, and/or the degree of mechanical action desired.

The mean diameter of the abrasive particles is typically less than about 500 nm, more preferably from about 10 nm to about 200 nm. For example, commercially available colloidal silicon oxide slurries typically contain abrasive particles having a mean diameter of, for example, from about 10 nm to about 50 nm. Commercially available fumed silicon oxide slurries contain abrasive particles having a mean diameter of, for example, from about 100 nm to about 200 nm. According to one embodiment, abrasive particles of varying sizes can be used in the slurry composition.

The suspension medium is typically present in an amount from about 50% to about 98%, preferably from about 70% to about 90%, by the combined weight of the abrasive particles and the suspension medium. The suspension medium preferably includes deionized (DI) water. The suspension medium preferably has a pH of greater than 7, more preferably a pH from about 11 to about 13. In an exemplary embodiment, the abrasive particles are homogeneously dispersed in the suspension medium. The combination of the abrasive particles and the suspension medium is typically present in an amount from about 80% to about 95%, preferably from about 85% to about 92%, and more preferably about 88.5%, by weight of the slurry composition.

According to a preferred embodiment, a commercially available slurry can be used to provide the abrasive particles and the suspension medium of the present slurry composition. In this embodiment, the suspension medium typically includes an alkali material such as, for example, potassium hydroxide (KOH) and/or ammonium hydroxide ($NH_4OH$). Typically, the alkali material is present in an amount from about 0.005% to about 0.01%, by the combined weight of the abrasive particles and the suspension medium.

In an alternative embodiment of the present invention, a composition is provided which does not include the abrasive particles. This composition comprises a peroxygen compound, an etching agent and an alkyl ammonium hydroxide. The composition can be used in a CMP process which employs a planarizing device that has an abrasive planarizing surface. The planarizing device can be, for example, a polishing pad. The abrasive surface of the planarizing device provides the mechanical planarizing action on the substrate. Therefore, including the abrasive particles in the composition is not necessary in this particular embodiment.

The slurry composition further includes a peroxygen compound. The addition of the peroxygen compound typically increases the oxide-to-silicon nitride polish rate selectivity of the slurry composition. While not being bound to any particular theory, it is believed that the peroxygen compound oxidizes the surface of the material to be planarized, making the surface more easily planarized by mechanical action.

Typical peroxygen compounds include, for example, hydrogen peroxide ($H_2O_2$), ozone ($O_3$), peroxymonosulfuric acid ($H_2SO_5$) and persulfates. Preferred are high-purity peroxygen compounds, such as hydrogen peroxide produced by the methods and apparatuses disclosed in U.S. Pat. Nos. 5,928,621; 5,932,187; 5,961,947; and 6,001,324. The contents of each of these documents are incorporated herein by reference. In a preferred embodiment of the present invention, the peroxygen compound includes hydrogen peroxide, ozone, ammonium persulfate (($NH_4)_2S_2O_8$) or combinations thereof, more preferably hydrogen peroxide. The peroxygen compound is typically present in an amount from about 0.02% to about 0.2%, preferably from about 0.07% to about 0.15%, more preferably about 0.08%, by weight of the slurry composition.

The peroxygen compound is typically present in an aqueous solution having a peroxygen compound concentration from about 20% to about 40%, preferably from about 30% to about 35%, and more preferably about 35%, by weight of the aqueous solution. The concentration of the peroxygen compound in the aqueous solution typically depends on the peroxygen compound that is being used. For example, the concentration of ozone in the aqueous solution can be the solubility limit of ozone in water at 25° C. The concentration of the peroxygen compound in the aqueous solution can also depend on the particular application of the slurry composition. In a preferred embodiment, combinations of peroxygen compounds can be used to increase the shelf-life of the composition. For example, combinations of peroxygen compounds can be used to compensate for the half-life of ozone in DI water.

The slurry composition can optionally include a stabilizing agent which reduces the decomposition of the peroxygen compound in the slurry composition. The stabilizing agent can include a phosphoric acid, a salt of a phosphoric acid, an organo-tin-phosphate or combinations thereof. Such stabilizing agents are disclosed in U.S. patent application Ser. No. 09/444,715, the contents of which application are incorporated herein by reference. Exemplary phosphoric acids include a polyphosphoric acid ($H_{n+2}P_nO_{3n+1}$, n>0), pyrophosphoric acid ($H_4P_2O_7$), metaphosphoric acid ($HPO_3$) and orthophosphoric acid ($H_3PO_4$). A preferred embodiment of the present invention includes the stabilizing agent present in an amount from about 0.01% to about 0.3%, more preferably from about 0.05% to about 0.1%, by weight of the slurry composition. The amount of stabilizing agent can be varied to provide a higher degree of peroxygen compound stabilization, depending on the particular application of the slurry composition.

In a preferred embodiment of the present invention, a salt of pyrophosphoric acid, preferably sodium pyrophosphate decahydrate ($Na_4P_2O_7.10H_2O$), can be employed as the stabilizing agent. Sodium pyrophosphate decahydrate has been found to provide excellent results as a stabilizing agent in slurry compositions. Alternatively, a different pyrophosphate which is soluble in the slurry composition can be employed as the stabilizing agent, such as potassium pyrophosphate.

The etching agent etches the surface of the material to be planarized, such as a semiconductor substrate. In a preferred embodiment of the invention, the etching agent comprises a fluoride compound. As used herein, the term "fluoride compound" includes any compound which comprises at least one fluorine atom. The etching agent is preferably capable of dissociating in an aqueous solution to provide fluoride ions or difluoride ions. Exemplary fluoride compounds include tetramethyl ammonium fluoride (($CH_3$)$_4NF$), ammonium fluoride ($NH_4F$), hydrogen fluoride (HF), and ammonium bifluoride, i.e., ammonium hydrogen bifluoride ($NH_4HF_2$), and combinations thereof. Of these compounds, ($CH_3$)$_4NF$, $NH_4F$ and $NH_4HF_2$ are solids. The etching agent is typically present in an amount from about 0.1% to about 1.0%, preferably from about 0.3% to about 0.6%, more preferably from about 0.4%, by weight of the slurry composition.

The etching agent is typically in an aqueous solution. The concentration of the etching agent in the aqueous solution is typically from about 4% to about 50% by the combined weight of the etching agent and the aqueous solution. For example, hydrogen fluoride is commercially available in concentrations of about 4.9% and about 49%.

The slurry composition also includes an alkyl ammonium hydroxide. The addition of the alkyl ammonium hydroxide to the slurry composition increases the oxide-to-silicon nitride polish rate selectivity thereof. While not being bound to any particular theory, the alkyl ammonium hydroxide, particularly the hydroxyl group thereof, is believed to provide chemical action which facilitates the mechanical planarization of the material to be planarized. The alkyl ammonium hydroxide is typically present in an amount from about 0.5% to about 10%, preferably from about 1% to about 5%, and more preferably about 2.4%, by weight of the slurry composition.

According to a preferred embodiment, the alkyl ammonium hydroxide can be tetrabutyl ammonium hydroxide (($C_4H_9$)$_4NOH$), tetraethyl ammonium hydroxide (($C_2H_5$)$_4NOH$), tetramethyl ammonium hydroxide (($CH_3$)$_4NOH$), and combinations thereof, preferably tetramethyl ammonium hydroxide.

The alkyl ammonium hydroxide is typically present in an aqueous solution. The concentration of the alkyl ammonium hydroxide in the aqueous solution is typically from about 2% to about 50%, preferably from about 20% to about 30%, more preferably about 25%, by the combined weight of the alkyl ammonium hydroxide and the aqueous solution. The slurry compositions of the present invention preferably provide an oxide-to-silicon nitride polish rate selectivity from about 40:1 to about 150:1. In a preferred embodiment of the invention, the oxide layer to be planarized comprises a silicon oxide layer.

The alkyl ammonium hydroxide typically acts as a passivating agent. The passivating agent typically forms a thin, protective layer on the surface of the substrate, thereby protecting the nitride layer from the chemical action of the slurry composition. Other materials which provide passivating action can also be included in the slurry composition such as, for example, compounds that include at least one alkyl or at least one phenyl group. Preferably, such compounds include, for example, tetrabutyl ammonium, salts of tetrabutyl ammonium hydroxide, salts of tetraethyl ammonium hydroxide, phenyls that are soluble only in water or aqueous solutions, and combinations thereof.

As mentioned above, each of the peroxygen compound, the etching agent and the alkyl ammonium hydroxide typically can be provided in an aqueous solution such as, for example, DI water. Also, the suspension medium typically comprises water. The total water content of the present slurry composition typically can include the water in these aqueous solutions and the suspension medium.

The slurry compositions of the present invention preferably include a surfactant which enhances the wettability of the surface being planarized and reduces vibrations caused by the CMP process. Suitable surfactants which can be used in the slurry compositions of the invention are known in the art and include, for example, Surfynol 440.

Various commercially available slurries can be used in manufacturing the slurry compositions of the present invention. The slurry that is employed typically includes abrasive particles and a suspension medium. Suitable amounts of the peroxygen compound, the etching agent and the alkyl ammonium hydroxide are typically combined with one of these commercial slurries to form the present slurry compositions.

The compositions of the present invention are formed by combining the components thereof. The components can be combined in any order. Typically, the abrasive particles and the suspension medium are combined prior to the other components of the composition. Preferably, the components can be combined in the following order: the abrasive particles, the suspension medium, the peroxygen compound, the etching agent and the alkyl ammonium hydroxide. Techniques and/or equipment known in the art for combining and/or mixing materials can be used, particularly techniques and/or equipment that are suitable for use in the semiconductor manufacturing industry.

According to a preferred embodiment, the components of the composition can be directly introduced to the substrate surface, thereby forming the composition on the substrate surface. For example, the composition formed by combining the peroxygen compound, the etching agent and the alkyl ammonium hydroxide, can be formed in this manner. The components of the present composition can be combined in the following order: the peroxygen compound, the etching agent and the alkyl ammonium hydroxide.

Alternatively, the composition can be formed prior to being introduced to the substrate surface. This allows the composition to be stored prior to use. For example, the slurry compositions of the present invention can be formed in this manner. The components preferably are combined a short time before being introduced to the substrate. When storage is necessary or convenient, the composition is preferably stored below about 25° C., but above the freezing temperature of the composition. The composition can be agitated prior to use to ensure a sufficient degree of mixing.

The present invention also provides methods for planarizing a substrate using chemical-mechanical planarization. According to one aspect of the present invention, a slurry composition is introduced to a substrate such as, for example, a semiconductor substrate. The slurry composition is typically introduced between the planarizing device and the substrate. The substrate is then planarized. A planarizing device such as a polishing pad is typically used to planarize the substrate.

In an alternative embodiment, methods are provided for planarizing a substrate using a slurry-less CMP process. In this embodiment, the composition does not include the abrasive particles. The composition can be introduced to a substrate such as, for example, a semiconductor substrate. More preferably, the individual, unmixed components of the composition can be introduced to the substrate. The composition is typically introduced between the planarizing device and the substrate. A planarizing device that has an abrasive surface can be used to planarize the substrate. The abrasive surface mechanically planarizes the substrate surface.

EXAMPLE

A slurry composition was formed by combining the following materials:
silica particles, 250 g;
DI water, 1537 g;
35% hydrogen peroxide, 4.5 g;
49% hydrofluoric acid, 17.5 g; and
25% tetramethyl ammonium hydroxide, 191 g.
In this exemplary embodiment, the silica particles and DI water were combined prior to the hydrogen peroxide, hydrofluoric acid and tetramethyl ammonium hydroxide.

While the invention has been described in detail with reference to specific embodiments thereof, it will be apparent to one skilled in the art that various changes and modifications can be made, and equivalents employed without departing from the scope of the claims.

What is claimed is:

1. A method for making a slurry composition, suitable for use in a chemical-mechanical planarization process for planarizing an oxide material arranged adjacent to a polishing stop material, comprising combining:
   (a) abrasive particles;
   (b) a suspension medium;
   (c) a peroxygen compound;
   (d) an etching agent effective to etch the oxide material; and
   (e) an alkyl ammonium hydroxide,
wherein the composition is effective for increasing the polish rate selectivity of the oxide material in comparison with the polishing stop material.

2. The method according to claim 1, wherein the chemical-mechanical planarization process is used in the formation of a shallow trench isolation structure on a semiconductor substrate.

3. The method according to claim 1, wherein the abrasive particles are formed of a material selected from the group consisting of silicon oxide, cerium oxide, aluminum oxide and combinations thereof.

4. The method according to claim 1, wherein the abrasive particles are present in an amount from about 2% to about 50% of the combined weight of the abrasive particles and the suspension medium.

5. The method according to claim 1, wherein the abrasive particles and the suspension medium are present in a combined amount from about 80% to about 95% by weight of the slurry composition.

6. The method according to claim 1, wherein the peroxygen compound comprises a material selected from the group consisting of hydrogen peroxide, ozone, ammonium persulfate and combinations thereof.

7. The method according to claim 1, wherein the peroxygen compound is present in an aqueous solution, and wherein the peroxygen compound is present in an amount from about 20% to about 40% by weight of the aqueous solution.

8. The method according to claim 1, wherein the peroxygen compound is present in an amount from about 0.02% to about 0.2% by weight of the slurry composition.

9. The method according to claim 1, wherein the etching agent comprises a fluoride compound.

10. The method according to claim 9, wherein the etching agent comprises a material selected from the group consisting of tetramethyl ammonium fluoride, ammonium fluoride, ammonium bifluoride, hydrogen fluoride and combinations thereof.

11. The method according to claim 10, wherein the etching agent comprises hydrofluoric acid.

12. The method according to claim 1, wherein the etching agent is present in an aqueous solution, and wherein the etching agent is present in an amount from about 4% to about 50% by weight of the aqueous solution.

13. The method according to claim 1, wherein the etching agent is present in an amount from about 0.1% to about 1% by weight of the slurry composition.

14. The method according to claim 1, wherein the alkyl ammonium hydroxide comprises tetramethyl ammonium hydroxide.

15. The method according to claim 1, wherein the alkyl ammonium hydroxide is present in an aqueous solution, and wherein the alkyl ammonium hydroxide is present in an amount from about 2% to about 50% by weight of the aqueous solution.

16. The method according to claim 1, wherein the alkyl ammonium hydroxide is present in an amount from about 0.5% to about 10% by weight of the slurry composition.

17. The method according to claim 1, wherein the slurry composition further comprises a stabilizing agent effective to stabilize the peroxygen compound, wherein the stabilizing agent comprises a material selected from the group consisting of sodium pyrophosphate, phosphoric acid, an organo-tin-phosphate and combinations thereof.

18. The method according to claim 1, wherein the slurry composition is formed by combining components (a), (b), (c), (d) and (e) sequentially.

19. The method according to claim 1, wherein components (a) and (b) are premixed.

20. The method according to claim 1, comprising combining:
   (a) abrasive particles formed of silicon oxide;
   (b) water;
   (c) hydrogen peroxide;
   (d) hydrofluoric acid; and
   (e) tetramethyl ammonium hydroxide.

21. A method for planarizing a substrate using chemical-mechanical planarization, comprising the steps of introducing the slurry composition made by the method of claim 1 to a substrate, and planarizing the substrate.

22. The method according to claim 21, wherein the method is used in the formation of a shallow trench isolation structure on a semiconductor substrate.

23. A slurry composition, suitable for use in a chemical-mechanical planarization process, formed by the method of claim 1.

24. A slurry composition, suitable for use in a chemical-mechanical planarization process, formed by the method of claim 9.

25. A slurry composition, suitable for use in a chemical-mechanical planarization process, formed by the method of claim 19.

26. A method for making a composition, suitable for use in a chemical-mechanical planarization process for planarizing an oxide material arranged adjacent to a polishing stop material, wherein an abrasive planarizing surface is used in the planarization process, comprising combining:

(a) a peroxygen compound;

(b) an etching agent effective to etch the oxide material; and (c) an alkyl ammonium hydroxide, wherein the composition is effective for increasing the polish rate selectivity of the oxide material in comparison with the polishing stop material.

27. The method according to claim 26, wherein the peroxygen compound comprises a material selected from the group consisting of hydrogen peroxide, ozone, ammonium persulfate and combinations thereof.

28. The method according to claim 26, wherein the etching agent comprises a fluoride compound.

29. The method according to claim 28, wherein the etching agent comprises a material selected from the group consisting of tetramethyl ammonium fluoride, ammonium fluoride, ammonium bifluoride, hydrogen fluoride and combinations thereof.

30. The method according to claim 29, wherein the etching agent comprises hydrofluoric acid.

31. The method according to claim 26, wherein the alkyl ammonium hydroxide comprises tetramethyl ammonium hydroxide.

32. The method according to claim 26, comprising combining:

(a) hydrogen peroxide;

(b) hydrofluoric acid; and (c) tetramethyl ammonium hydroxide.

33. The method according to claim 26, wherein the composition is formed by combining components (a), (b) and (c) sequentially.

34. A method for planarizing a substrate using chemical-mechanical planarization, comprising the steps of introducing the composition made by the method of claim 26 to a substrate, and planarizing the substrate with a planarizing device comprising the abrasive planarizing surface.

35. A composition, suitable for use in a chemical-mechanical planarization process wherein an abrasive planarizing surface is used in the planarization process, formed by the method of claim 26.

36. A composition, suitable for use in a chemical-mechanical planarization process wherein an abrasive planarizing surface is used in the planarization process, formed by the method of claim 28.

37. A composition, suitable for use in a chemical-mechanical planarization process wherein an abrasive planarizing surface is used in the planarization process, formed by the method of claim 32.

38. Method according to claim 1, wherein the polish rate selectivity ratio of the oxide material to the polishing stop material is from about 40:1 to about 150:1.

39. Method according to claim 26, wherein the polish rate selectivity ratio of the oxide material to the polishing stop material is from about 40:1 to about 150:1.

* * * * *